(12) United States Patent
Helmick, IV

(10) Patent No.: US 11,785,697 B2
(45) Date of Patent: Oct. 10, 2023

(54) SYSTEMS AND METHODS FOR MONITORING ELECTROSTATIC BUILDUP FOR AN ATTRACTION SYSTEM

(71) Applicant: Universal City Studios LLC, Universal City, CA (US)

(72) Inventor: Nathaniel David Helmick, IV, Winter Park, FL (US)

(73) Assignee: Universal City Studios LLC, Universal City, CA (US)

( * ) Notice: Subject to any disclaimer, the term of this patent is extended or adjusted under 35 U.S.C. 154(b) by 13 days.

(21) Appl. No.: 17/570,651

(22) Filed: Jan. 7, 2022

(65) Prior Publication Data

US 2023/0225038 A1    Jul. 13, 2023

(51) Int. Cl.
| | | |
|---|---|---|
| H05F 3/06 | (2006.01) | |
| H05F 3/02 | (2006.01) | |
| G01R 29/12 | (2006.01) | |
| A63G 31/00 | (2006.01) | |
| A63G 31/16 | (2006.01) | |
| A63G 7/00 | (2006.01) | |

(52) U.S. Cl.
CPC ............ H05F 3/02 (2013.01); G01R 29/12 (2013.01); H05F 3/06 (2013.01); *A63G 7/00* (2013.01); *A63G 31/007* (2013.01); *A63G 31/16* (2013.01)

(58) Field of Classification Search
CPC .. H05F 3/02; H05F 3/06; G01R 29/12; H01T 23/00
See application file for complete search history.

(56) References Cited

U.S. PATENT DOCUMENTS

| | | | |
|---|---|---|---|
| 5,259,553 A * | 11/1993 | Shyu .................. | F24F 1/022 |
| | | | 236/44 C |
| 6,741,445 B1 | 5/2004 | Phan et al. | |
| 6,847,126 B2 | 1/2005 | Adamson | |
| 6,873,515 B2 * | 3/2005 | Chang .................. | H05F 3/04 |
| | | | 361/231 |
| 7,522,402 B2 * | 4/2009 | Kraz .................... | H01T 23/00 |
| | | | 361/231 |
| 7,586,731 B2 * | 9/2009 | Sato .................... | H01T 19/04 |
| | | | 361/231 |
| 10,207,750 B2 | 2/2019 | Tanahashi et al. | |
| 10,888,794 B1 | 1/2021 | Nelson et al. | |

(Continued)

FOREIGN PATENT DOCUMENTS

| | | |
|---|---|---|
| CN | 110917632 A | 3/2020 |
| KR | 200374070 | 1/2005 |

OTHER PUBLICATIONS

PCT/US2023/010132 International Search Report and Written Opinion dated May 10, 2023.

*Primary Examiner* — Scott Bauer
(74) *Attorney, Agent, or Firm* — Fletcher Yoder, P.C.

(57) ABSTRACT

An attraction system of an amusement park includes a sensor configured to monitor electrostatic buildup associated with the attraction system and a control system communicatively coupled to the sensor. The control system is configured to receive data from the sensor, the data being indicative of an amount of the electrostatic buildup associated with the attraction system, and operate the attraction system based on the data indicative of the amount of the electrostatic buildup associated with the attraction system.

20 Claims, 3 Drawing Sheets

(56) References Cited

U.S. PATENT DOCUMENTS

| | | | |
|---|---|---|---|
| 2003/0165040 A1* | 9/2003 | Posadas | H05F 3/04 |
| | | | 361/213 |
| 2004/0167679 A1* | 8/2004 | Sasaki | H01T 23/00 |
| | | | 701/1 |
| 2016/0195856 A1* | 7/2016 | Spero | H05B 47/155 |
| | | | 700/90 |
| 2018/0297420 A1 | 10/2018 | Yamada et al. | |
| 2019/0075640 A1* | 3/2019 | Iben | H01T 19/04 |

* cited by examiner

SYSTEMS AND METHODS FOR MONITORING ELECTROSTATIC BUILDUP FOR AN ATTRACTION SYSTEM

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Amusement parks or theme parks include various features to provide entertainment for guests. For example, the amusement park may include different attraction systems, such as a roller coaster, a motion simulator, a drop tower, a performance show, a log flume, and so forth. Electrostatic buildup or ionization may accumulate during operation of some of the attraction systems, such as via electricity conducted within an attraction system and/or contact between various components within the attraction system. The electrostatic buildup may impact an operation of the attraction system, such as by affecting electrical conduction used to actuate or supply power to certain equipment. Thus, the attraction system may not operate as desired when there is substantial electrostatic buildup. As such, there is a need to mitigate electrostatic buildup to improve operation of attraction systems.

SUMMARY

Certain embodiments commensurate in scope with the originally claimed subject matter are summarized below. These embodiments are not intended to limit the scope of the claimed subject matter, but rather these embodiments are intended only to provide a brief summary of possible forms of the subject matter. Indeed, the subject matter may encompass a variety of forms that may be similar to or different from the embodiments set forth below.

In an embodiment, an attraction system of an amusement park includes a sensor configured to monitor electrostatic buildup associated with the attraction system and a control system communicatively coupled to the sensor. The control system is configured to receive data from the sensor, the data being indicative of an amount of the electrostatic buildup associated with the attraction system, and operate the attraction system based on the data indicative of the amount of the electrostatic buildup associated with the attraction system.

In an embodiment, a non-transitory computer-readable medium includes instructions that, when executed by processing circuitry, are configured to cause the processing circuitry to monitor an amount of electrostatic buildup associated with an attraction system, determine that the amount of electrostatic buildup is greater than a threshold value, and adjust operation of the attraction system in response to determining that the amount of electrostatic buildup is greater than the threshold value.

In an embodiment, an attraction system includes a ride vehicle and a control system configured to operate the attraction system in a first operating mode to move the ride vehicle, determine that an amount of electrostatic buildup associated with the ride vehicle exceeds a threshold value during operation of the attraction system in the first operating mode, and adjust the operation of the attraction system from the first operating mode to a second operating mode to reduce the amount of electrostatic buildup associated with the ride vehicle in response to determining that the amount of electrostatic buildup exceeds the threshold value during the operation of the attraction system in the first operating mode.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
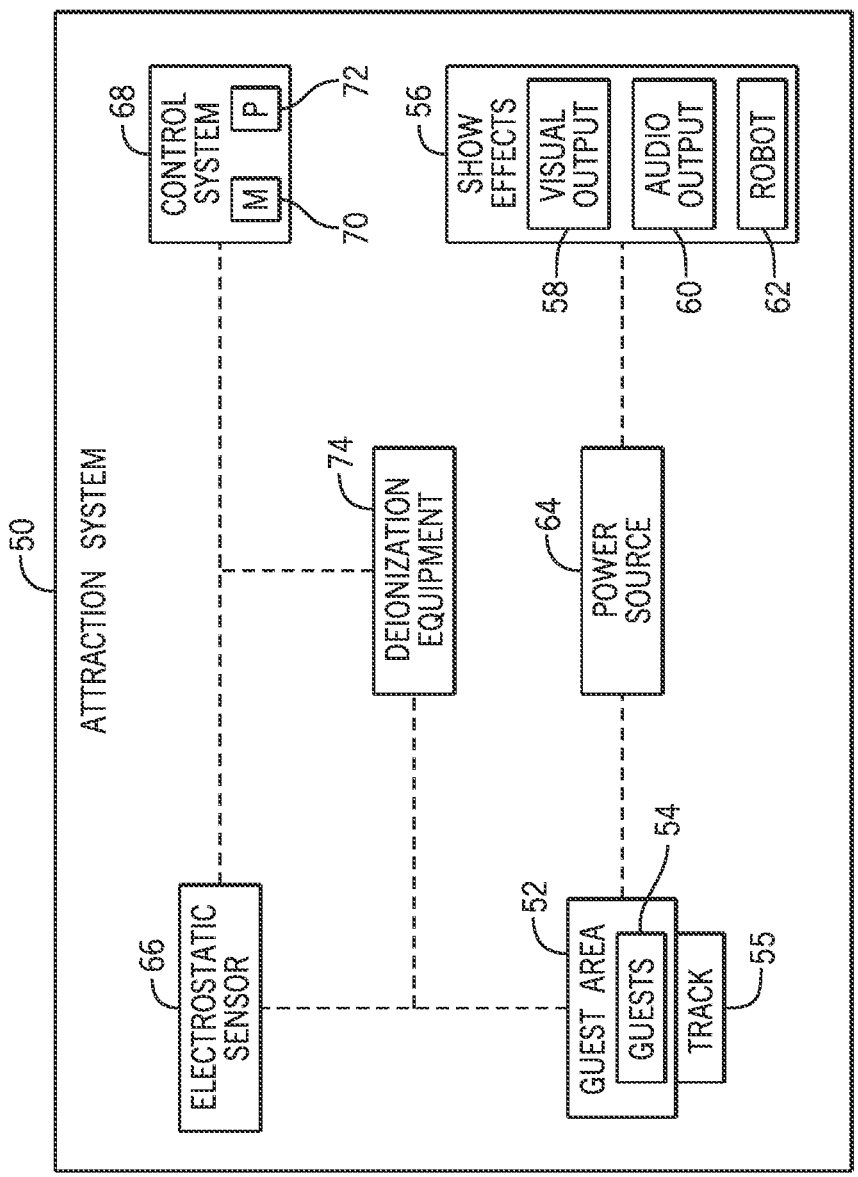
FIG. 1 is a schematic diagram of an embodiment of an attraction system, in accordance with an aspect of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The present disclosure is directed to an attraction system, such as a roller coaster, a performance show, a water ride, an extended reality ride or experience, for an amusement or theme park. The attraction system may accommodate a number of guests and may include a variety of features to entertain the guests. For example, the attraction system may include a guest area, such as a ride vehicle and/or a theater-like seating arrangement, where a guest may be positioned (e.g., seated, secured). The attraction system may entertain the guest positioned in the guest area, such as via show effects and/or by moving the guest area to provide movement sensations.

Unfortunately, the attraction system may experience electrostatic or ionization buildup (e.g., a buildup or accumulation of static electricity). In general, electrostatic buildup is caused by an imbalance of positive and negative charges within an object, which may be caused by electron flow to and/or from the object. As an example, electricity may be transmitted through the attraction system to supply power to and/or actuate various equipment (e.g., a show effect, a ride vehicle), and the transmission of electricity may cause the imbalance of charges that results in electrostatic buildup. As another example, certain objects within the attraction system (e.g., a wheel of a ride vehicle and a ride track) may contact one another to cause electrons to flow between the objects and therefore cause the imbalance of charges. In either case, the electrostatic buildup may result in an electrostatic discharge, which may include a sudden flow of electrons to and/or from the object caused by electrostatic forces (e.g., attractive forces, repulsion forces) generated via the imbalance of charges. The electrostatic discharge may affect operation of the attraction system. For example, the electrostatic discharge may interrupt (e.g., block, reduce) a flow of electricity through the attraction system to affect operation of various equipment. The electrostatic discharge may also be sensed by the guest and may therefore affect the experience of the guest. In this manner, the electrostatic buildup and the electrostatic discharge may impact the guest experience provided by the attraction system.

Thus, it is presently recognized that mitigating and/or limiting effects of electrostatic buildup and/or electrostatic discharge may improve operation of an attraction system. For example, it may be desirable to perform an action that mitigates the electrostatic buildup when the electrostatic buildup exceeds a certain amount (e.g., measured value). Accordingly, embodiments of the present disclosure are directed to monitoring an amount of electrostatic buildup in an attraction system to determine when a mitigating action may be performed to address the electrostatic buildup. In an embodiment, a sensor (e.g., an electrostatic sensor) may monitor an amount of electrostatic buildup associated with the attraction system, a control system may receive data from the sensor, and the data may be indicative of the amount of electrostatic buildup. The control system may operate based on the amount of electrostatic buildup indicated by the data, such as to operate the attraction system to reduce the amount of electrostatic buildup in response to a determination that the amount of electrostatic buildup exceeds a threshold value. As an example, the control system may operate deionization equipment to reduce the amount of electrostatic buildup, output a notification to prompt a user to address the amount of electrostatic buildup, and/or suspend operation of the attraction system to block the electrostatic buildup from affecting the attraction system (e.g., an operation, a structural integrity associated with the attraction system). In this manner, operation of the control system and the sensor may collectively block impact of the electrostatic buildup on the attraction system.

It should be noted that the control system and the sensor may operate to monitor the amount of electrostatic buildup associated with the attraction system while the attraction system is in operation to entertain guests. Indeed, the monitoring of the amount of electrostatic buildup may not affect operation of the attraction system to entertain guests, such as movement of a ride vehicle along a track. As an example, instead of suspending the attraction system in order to determine whether there is excessive electrostatic buildup (e.g., via manual inspection of the attraction system), the attraction system may continue to operate while the control system and the sensor automatically determine whether there is excessive electrostatic buildup. For this reason, the control system and the sensor may enable efficient operation of the attraction system while monitoring the amount of electrostatic buildup.

With the preceding in mind, FIG. 1 is a schematic diagram of an embodiment of an attraction system 50 of an amusement park. For example, the attraction system 50 may include a roller coaster, a motion simulator, a water ride, a walk through attraction (e.g., a maze), and the like. The attraction system 50 may include a guest area 52 where various guests 54 may be located. In an embodiment, the guest area 52 may include or be defined by a ride vehicle, which may move (e.g., translate, rotate) along a track or path 55 of the attraction system 50. In an additional or alternative embodiment, the guest area 52 may pivot about a motion base and/or remain stationary within the attraction system 50. In a further embodiment, the guest area 52 may include an open space, such as a walkable area (e.g., a queue or line). The attraction system 50 may also include show effects 56, which may be operated to enhance the guest experience provided by the attraction system 50, such as to the guests 54 in the guest area 52. For instance, the show effects 56 may include a visual output 58 (e.g., lighting, a video, displays), an audio output 60 (e.g., a sound, an alarm), and/or a robot 62 (e.g., a movable object, an animated figure).

The attraction system 50 may experience electrostatic buildup during operation. As an example, certain objects within the attraction system 50 may contact one another. For instance, contact between the guest area 52 (e.g., wheels of a ride vehicle) and the track 55 may cause electrostatic buildup in the guest area 52. As another example, electricity may be transmitted to supply electrical power to the attraction system 50, such as from a power source 64, which may include a battery, a power grid, and/or a generator. In an embodiment, the electrical power provided by the power source 64 may enable operation of the show effects 56, such as to present the visual output 58, to provide the audio output 60, and/or to move the robot 62. In an additional or alternative embodiment, the electrical power provided by the power source 64 may enable operation of the guest area 52, such as movement of the guest area 52 (e.g., along the track 55). The flow of electricity through the attraction system 50, such as through an electrical bus or connector system and/or to on-board electrical components (e.g., of the guest area 52), may cause electrostatic buildup within the attraction system 50.

For this reason, the attraction system 50 may include an electrostatic sensor 66 configured to monitor an amount of electrostatic buildup associated with the attraction system 50. The electrostatic sensor 66 may include, for example, an electrostatic fieldmeter (e.g., a field meter), an ionization sensor, electrostatic discharge equipment, and/or any other suitable sensor configured to determine an amount of electrostatic buildup associated with an object, such as by determining an electrostatic force or field caused by a charge on a surface of the object. The electrostatic sensor 66 may, in an embodiment, determine the amount of electrostatic buildup without contacting the object. Therefore, the electrostatic sensor 66 may not affect operation (e.g., movement) of the object. In the illustrated embodiment, the electrostatic sensor 66 is configured to determine an electrostatic buildup associated with the guest area 52 (e.g., a ride vehicle where the guests 54 are positioned). To this end, the electrostatic sensor 66 may be positioned on, adjacent to, and/or in engagement with the guest area 52. By way of example, for a guest area 52 configured to move about the track 55, the electrostatic sensor 66 may be secured at a particular location along the track 55 (e.g., at a loading/unloading station) to enable the electrostatic sensor 66 to determine a particular amount of electrostatic buildup associated with the guest area 52 each time the guest area 52 traverses the particular location. In an additional or alternative embodiment, the electrostatic sensor 66 may be configured to determine an electrostatic buildup associated with any other suitable object (e.g., a moving loading platform or other people mover) of the attraction system 50, such as the power source 64 and/or equipment that provides the show effects 56. In either embodiment, the electrostatic sensor 66 may repeatedly determine the amount of electrostatic buildup, such as at a particular frequency during operation of the attraction system 50, to determine whether the electrostatic buildup associated with the attraction system 50 is excessive.

The attraction system 50 may also include or be communicatively coupled to a control system 68 (e.g., an automation controller, an electronic controller). The control system 68 may include a memory 70 and processing circuitry 72. The memory 70 may include volatile memory, such as random access memory (RAM), and/or non-volatile memory, such as read-only memory (ROM), optical drives, hard disc drives, solid-state drives, or any other non-transitory computer-readable medium that includes instructions to operate the attraction system 50. The processing circuitry 72 may be configured to execute such instructions. For example, the processing circuitry 72 may include one or more application specific integrated circuits (ASICs), one or more field programmable gate arrays (FPGAs), one or more general purpose processors, or any combination thereof. The control system 68 may be communicatively coupled to the electrostatic sensor 66 and may receive sensor data from the electrostatic sensor 66. The sensor data may be indicative of the amount of electrostatic buildup monitored by the electrostatic sensor 66, because the sensor operates to output data correlative to detected levels of such electrostatic buildup. While the control system 68 receives the sensor data from the electrostatic sensor 66, the attraction system 50 may continue to operate and entertain the guests 54. Additionally, the control system 68 may control certain operations (e.g., equipment operation, ride operation, power supply operation) based on the amount of electrostatic buildup indicated by the sensor data.

For example, in an embodiment, the control system 68 may compare the amount of electrostatic buildup indicated by the sensor data to a threshold value or amount, which may be predetermined or preset and may be associated with an undesirable (e.g., excessive) amount of electrostatic buildup. As such, the control system 68 may perform an action to address the electrostatic buildup associated with the attraction system 50 in response to a determination that the amount of electrostatic buildup exceeds the threshold value. For instance, the attraction system 50 may include deionization equipment 74 that may be used to reduce the electrostatic buildup associated with the attraction system 50. The deionization equipment 74 may include a grounding medium (e.g., a strap, a chain, a brush) that may contact an object to reduce the electrostatic buildup of the object. The grounding medium, upon contacting the object, may enable flow of electrons between the grounding medium and the object to reduce a number of charged ions, thereby balancing and/or dispersing an electrostatic charge and mitigating the electrostatic buildup associated with the object. Thus, the grounding medium may include a conductive material, and the deionization equipment 74 may include an engagement mechanism (e.g., an actuator, a linkage system) to cause the grounding medium to contact the object and facilitate the flow of electrons. The deionization equipment 74 may additionally or alternatively include a spray system, such as a nozzle, an orifice, a sprinkler, an opening, and so forth, configured to output deionizing material, which may include any suitable fluidized material (e.g., air, water, powdered material) that has charged particles and/or facilitates flow of electrons. The deionizing material, upon contact with the object, may facilitate flow of electrons through the object to reduce the electrostatic buildup of the object. The deionization equipment 74 may further include any other suitable component configured to reduce the electrostatic buildup of the object, such as by facilitating flow of electrons.

In one embodiment, the control system 68 may be communicatively coupled to the deionization equipment 74 and may be configured to control operation of the deionization equipment 74. By way of example, in response to a determination that the amount of electrostatic buildup exceeds the threshold value, the control system 68 may instruct the deionization equipment 74 to actuate (e.g., move to contact an object, output deionizing material onto the object) and reduce the amount of electrostatic buildup (e.g., until the amount of electrostatic buildup is determined to be below the threshold value). In this manner, the control system 68 may automatically reduce the electrostatic buildup associated with the attraction system 50.

In such an embodiment, the control system 68 may control an amount, rate, and/or frequency of deionization provided by the deionization equipment 74 based on the determined amount of electrostatic buildup. As an example, for a higher amount of electrostatic buildup (e.g., an increased charge of an object), the control system 68 may operate the deionization equipment 74 to provide increased deionization, such as to cause the deionizing material to be output at a greater flow rate (e.g., by increasing a size of an opening of a nozzle configured to output the deionizing material, by increasing speed of the deionizing material discharged through the nozzle). For a lower amount of electrostatic buildup, the control system 68 may operate the deionization equipment 74 to provide reduced deionization, such as to cause the deionizing material to be output at a reduced flow rate (e.g., by reducing a size of an opening of a nozzle configured to output the deionizing material, by reducing speed of the deionizing material discharged through the nozzle). Indeed, as the amount of electrostatic buildup changes because of a deionizing operation, the operation of the deionization equipment 74 may also be adjusted accordingly, such as to gradually reduce a rate of deionization being provided. Thus, the deionization operation may be effectuated more suitably based on the amount of electrostatic buildup to be reduced.

In an additional or alternative embodiment, the control system 68 may output a notification in response to a determination that the amount of electrostatic buildup exceeds the threshold value. The notification may inform a user, such as an operator and/or a technician, that there is excessive electrostatic buildup associated with the attraction system 50. For example, the notification may include a visual output, an audio output, a notification transmitted to a device (e.g., a mobile phone, a tablet) associated with the user, another suitable feature, or any combination thereof. The notification may prompt the user to manually address the electrostatic buildup, such as to manually operate the deionization equipment 74. Furthermore, the notification may also indicate an undesirable operation of the attraction system 50 and/or the deionization equipment 74. For instance, a frequency of transmission of the notification being above a threshold frequency may indicate that a frequency in which the electrostatic buildup becomes excessive may be undesirable or atypical. By way of example, the deionization equipment 74 may not sufficiently reduce excessive electrostatic buildup associated with the attraction system 50, and/or the operation of the attraction system 50 may cause the electrostatic buildup to occur at an undesirably elevated rate. Thus, a frequency of receipt of a notification indicative of a detected excessive electrostatic buildup may prompt the user to perform maintenance on the attraction system 50 (e.g., the deionization equipment 74) in addition to or as an alternative to manually reducing the electrostatic buildup.

In a further embodiment, the control system 68 may adjust (e.g., suspend) operation of a component or element of the attraction system 50 in response to a determination that the amount of electrostatic buildup exceeds the threshold value. As an example, the control system 68 may block movement of the guest area 52 (e.g., along the track 55), block guests from entering the guest area 52, block operation of any of the show effects 56, and/or interrupt power supplied by the power source 64. Adjusting operation of the component of the attraction system 50 may enable the electrostatic buildup to be more easily addressed, such as to facilitate accessibility of the object of which the electrostatic buildup may be reduced (e.g., via the deionization equipment 74). Adjusting operation of the component of the attraction system 50 may additionally or alternatively block further electrostatic buildup, thereby enabling the electrostatic buildup to be more readily reduced. After the electrostatic buildup has been reduced (e.g., the amount of electrostatic buildup is below another threshold value), the control system 68 may resume operation of the component of the attraction system 50 (e.g., without operating to reduce the electrostatic buildup of the component).

Figure 2:
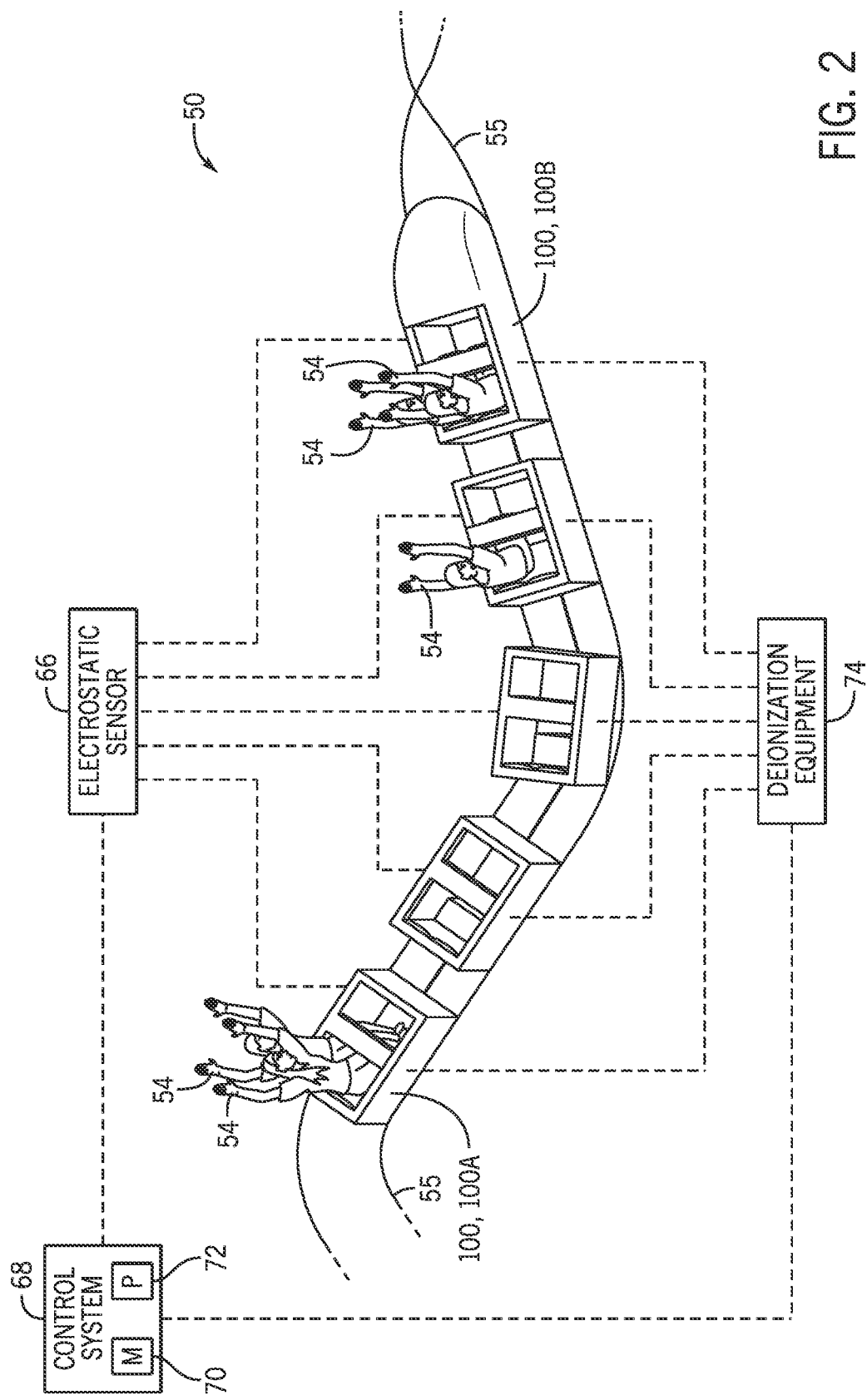
FIG. 2 is a side perspective view of an embodiment of an attraction system with multiple ride vehicles, in accordance with an aspect of the present disclosure.

FIG. 2 is a side perspective view of an embodiment of the attraction system 50. The illustrated attraction system 50 includes multiple ride vehicles 100 configured to move along the track 55. In an embodiment, the electrostatic sensor 66 or multiple electrostatic sensors 66 may be configured monitor respective amounts of electrostatic buildup for each of the ride vehicles 100 and/or the track 55. That is, the amount of electrostatic buildup associated with each ride vehicle 100 may be different from one another, and the electrostatic sensor(s) 66 may determine the different amounts of electrostatic buildup and provide sensor data indicative of the amounts of electrostatic buildup to the control system 68. The control system 68 may compare the respective amounts of the electrostatic buildups to the threshold value (e.g., a common threshold value, respective threshold values) and operate the attraction system 50 based on the comparison.

In an embodiment, the control system 68 may operate to address the amount of electrostatic buildup associated with a particular one of the ride vehicles 100. For instance, the control system 68 may operate the deionization equipment 74 to independently reduce the respective electrostatic buildups associated with the ride vehicles 100. In other words, the control system 68 may operate the deionization equipment 74 to reduce the amount of electrostatic buildup associated with an individual one of the ride vehicles 100 and not the amount of electrostatic buildup associated with another one of the ride vehicles 100. As an example, the control system 68 may determine that a first amount of electrostatic buildup associated with a first ride vehicle 100A may exceed the threshold value. However, the control system 68 may determine that the amount of electrostatic buildup associated with a remainder of the ride vehicles 100, such as a second amount of electrostatic buildup associated with a second ride vehicle 100B, may not exceed the threshold value. As a result, the control system 68 may instruct the deionization equipment 74 to reduce the first amount of electrostatic buildup associated with the first ride vehicle 100A, but may block operation of the deionization equipment 74 from reducing the second amount of electrostatic buildup associated with the second ride vehicle 100B. Thus, the control system 68 may block excessive operation of the deionization equipment 74, such as operation to reduce electrostatic buildup that has not sufficiently accumulated to exceed the threshold value, thereby reducing a cost associated with operation of the deionization equipment 74 and/or prolonging a lifespan of the deionization equipment 74. In another example, the control system 68 may output a notification that indicates the specific ride vehicle 100 (e.g., the first ride vehicle 100A) in which the amount of electrostatic buildup exceeds the threshold value. Thus, the notification may enable a user to reduce the amount of electrostatic buildup for the indicated ride vehicle 100 instead of other ride vehicles 100 that may not be associated with excessive electrostatic buildup. As such, the user may more quickly or readily address the determined excessive electrostatic buildup. In another embodiment, automated action (e.g., deployment of the deionization equipment 74) may be taken for individual components of the attraction system 50 based on detected need for reduction of static buildup. For example, the indicated ride vehicle 100 may be sprayed with deionization material while other aspects of the attraction system 50 are not sprayed.

The control system 68 may further suspend operation of the ride vehicles 100 in response to a determination that an associated amount of electrostatic buildup exceeds the threshold value. For example, the control system 68 may block movement of the ride vehicles 100 along the track 55. In one embodiment, each of the ride vehicles 100 may be physically coupled to one another (e.g., to form a train). Thus, the ride vehicles 100 may collectively move along the track 55. In such an embodiment, the control system 68 may suspend operation of each ride vehicle 100 (e.g., an entirety of the train) in response to a determination that the amount of electrostatic buildup for at least one of the ride vehicles 100 exceeds the threshold value to enable the amount of electrostatic buildup to be addressed. That is, although the particular ride vehicle(s) 100 associated with the excessive electrostatic buildup (e.g., and not another ride vehicle 100 that is not associated with the excessive electrostatic buildup) may be addressed to reduce the amount of electrostatic buildup, operation of each of the ride vehicles 100 may be suspended to facilitate reducing the amount of electrostatic buildup for the particular ride vehicle(s) 100.

In an additional or alternative embodiment, the ride vehicles 100 may not be physically coupled to one another and instead, each ride vehicle 100 may move independently of one another along the track 55. In this embodiment, in response to a determination that the amount of electrostatic buildup associated with one of the ride vehicles 100 is above the threshold value, the control system 68 may suspend operation of the ride vehicle 100 and not of other ride vehicles 100. By way of example, in response to a determination that the second amount of electrostatic buildup associated with the first ride vehicle 100A is above the threshold value, the control system 68 may suspend operation of the first ride vehicle 100A, such as by blocking movement of the first ride vehicle 100A along the track 55. However, the control system 68 may determine that the first amount of electrostatic buildup associated with the second ride vehicle 100B is below the threshold value. In response, the control system 68 may not suspend operation of the second ride vehicle 100B. For example, the control system 68 may enable movement of the second ride vehicle 100B along the track 55 while blocking movement of the first ride vehicle 100A along the track 55. As such, a determination that the amount of electrostatic buildup associated with one of the ride vehicles 100 exceeds the threshold value may result in a corresponding action to address the amount of electrostatic buildup associated with the ride vehicle 100 without affecting operation of another of the ride vehicles 100. In this manner, the control system 68 may efficiently operate the attraction system 50 to entertain the guests 54 while reducing the amount of electrostatic buildup associated with the ride vehicles 100.

Furthermore, in an embodiment, the control system 68 may determine a frequency and/or quantity in which an excessive electrostatic buildup (e.g., an occurrence in which an amount of electrostatic buildup exceeds the threshold value) is detected. The control system 68 may compare the frequency and/or quantity to a threshold frequency and/or threshold quantity, respectively. In response to a determination that the frequency exceeds the threshold frequency and/or the quantity exceeds the threshold quantity, the control system 68 may suspend operation of the attraction system 50, such as operation of each of the ride vehicles 100 and/or of show effects (e.g., the show effects 56 of FIG. 1). For example, the frequency and/or quantity exceeding the threshold frequency and/or the threshold quantity may indicate an undesirable operation or condition, such as a structural change, a faulty operation of the deionization equipment 74 and/or the electrostatic sensor 66, and/or a fault associated with the show effects 56, of the attraction system 50 that may be causing the excessive electrostatic buildup to occur at an undesirable rate. Thus, the control system 68 may suspend operation of the attraction system 50 to enable the undesirable operation or condition to be addressed more easily, such as to enable performance of a maintenance operation.

Figure 3:
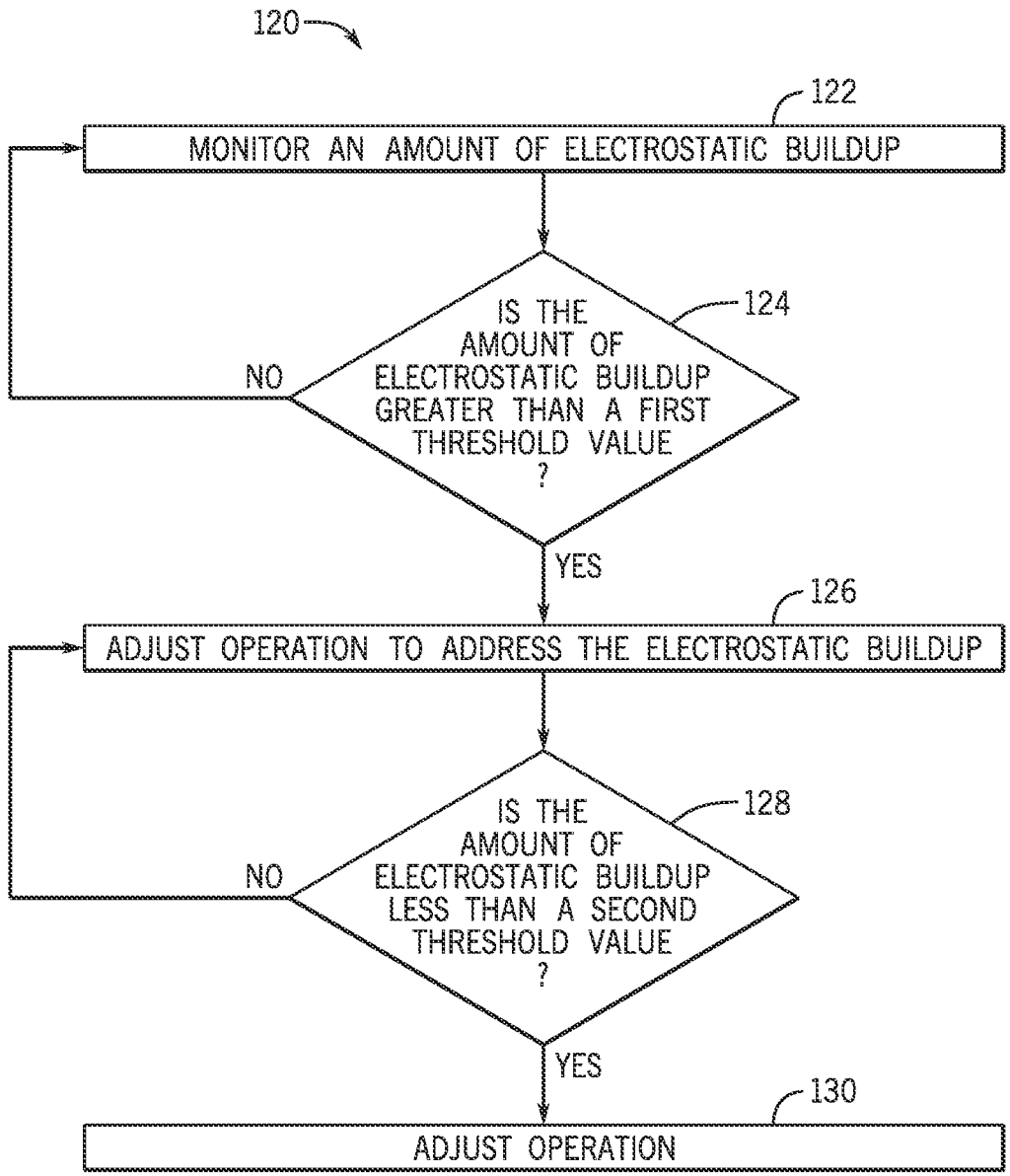
FIG. 3 is a flowchart of a method or process for operating an attraction system, in accordance with an aspect of the present disclosure.

FIG. 3 is a flowchart of an embodiment of a method or process 120 for operating an attraction system (e.g., the attraction system 50) based on an amount of electrostatic buildup. Any suitable device or component (e.g., the processing circuitry 72 of the control system 68) may perform the method 120. In one embodiment, the method 120 may be implemented by executing instructions stored in a tangible, non-transitory, computer-readable medium (e.g., the memory 70 of the control system 68). For example, the method 120 may be performed at least in part by one or more software components, one or more software applications, and the like. While the method 120 is described using steps in a specific sequence, additional steps may be performed, the described steps may be performed in different sequences than the sequence illustrated, and/or certain described steps may be skipped or not performed altogether.

At block 122, an amount of electrostatic buildup may be monitored. For example, sensor data may be received from the electrostatic sensor, and the sensor data may indicate the amount of electrostatic buildup. While the electrostatic buildup is monitored, the attraction system may continue to operate to entertain guests. At block 124, the amount of electrostatic buildup may be compared to a first threshold value to determine whether the amount of electrostatic buildup is greater than the first threshold value. In response to a determination that the electrostatic buildup is not greater than the threshold value, no further action may be performed, and the amount of electrostatic buildup may continue to be monitored, as described at block 122.

However, at block 126, in response to a determination that the amount of electrostatic buildup is greater than the first threshold value, operation of the attraction system may be adjusted to mitigate the electrostatic buildup. By way of example, the attraction system may initially be operated in a first operating mode (e.g., an operating mode in which electrostatic buildup is not actively being addressed or reduced) to entertain guests. However, in response to a determination that the amount of electrostatic buildup is greater than the first threshold value, operation of the attraction system may be transitioned to a second operating mode. An action to address or reduce the amount of electrostatic buildup may be performed during the operation of the attraction system in the second operating mode. In an embodiment, the action may include instructing the deionization equipment to reduce the amount of electrostatic buildup. A particular operation of the deionization equipment, such as a flow rate, speed, and/or amount of deionizing material output by the deionization equipment, may be based on the amount of electrostatic buildup. For example, the deionizing material may be output at a greater flow rate, speed, and/or amount for a higher detected amount of electrostatic buildup. In an additional or alternative embodiment, the action may include outputting a notification to prompt a user to address the electrostatic buildup, such as to manually operate the deionization equipment to reduce the amount of electrostatic buildup. In one embodiment, the attraction system may continue to operate to entertain guests while operating in the second operating mode. For example, the guest area may continue to move and/or the show effects may continue to operate while the deionization equipment is being operated (e.g., automatically operated, manually operated). However, certain functions or operations of the attraction system (e.g., of a component, a device, an element, equipment of the attraction system) may be suspended during the operation of the attraction system in the second operating mode in an additional or alternative embodiment to enable the electrostatic buildup to be more easily addressed.

The amount of electrostatic buildup may continue to be monitored during the operation of the attraction system in the second operating mode, such as during or after performance of the action to address the electrostatic buildup. At block 128, the amount of electrostatic buildup may be compared to a second threshold value to determine whether the electrostatic buildup has been properly addressed and/or reduced via the second operating mode. In an embodiment, the second threshold value may be less than the first threshold value and may therefore indicate that the electrostatic buildup has been sufficiently reduced (e.g., to a level that may not affect operation of the attraction system). In response to a determination that the amount of electrostatic buildup is not less than the second threshold value, the attraction system may continue to be operated in the second operating mode, in which the action may continue to be performed to address the electrostatic buildup in order to reduce the electrostatic buildup.

However, at block 130, in response to a determination that the amount of electrostatic buildup is less than the second threshold value, the operation of the attraction system may be adjusted. By way of example, the operation of the attraction system may be adjusted from the second operating mode to the first operating mode. That is, the operation of the attraction system may be reverted to the operation prior to the determination that the amount of electrostatic buildup is greater than the first threshold value. As an example, for the embodiment in which the deionization equipment is automatically operated to reduce the amount of electrostatic buildup, the operation of the attraction system may be adjusted to suspend operation of the deionization equipment. As another example, for the embodiment in which a certain operation of the attraction system is adjusted or suspended (e.g., movement of the guest area is blocked), such operation of the attraction system may be initiated (e.g., to enable movement of the guest area).

A further action may additionally or alternatively be performed in response to the determination that the amount of electrostatic buildup is less than the second threshold value. For instance, for the embodiment in which the notification is output to indicate an excessive electrostatic buildup, an additional notification may be output to indicate that the electrostatic buildup has been adequately addressed. By way of example, a user may initially be notified that the electrostatic buildup is excessive and may manually address the excessive electrostatic buildup. The additional notification may indicate to the user that the electrostatic buildup is no longer excessive, thereby informing the user that the excessive electrostatic buildup has been sufficiently addressed. Additionally or alternatively, for the embodiment in which the deionization equipment is operated during the operation of the attraction system in the second operating mode, the deionization equipment may no longer be in operation in response to the determination that the amount of electrostatic buildup is less than the second threshold value. Thus, wearing of the deionization equipment may be reduced (e.g., operation of the deionization equipment may be limited to when there is an excessive electrostatic buildup). Furthermore, the operation of the attraction system may be adjusted to entertain the guests instead of to continue to address electrostatic buildup.

The method 120 may be repeatedly performed during operation of the attraction system. That is, while the attraction system is in operation, the amount of electrostatic buildup associated with the attraction system may be repeatedly monitored, and the attraction system may be operated (e.g., in the first operating mode, in the second operating mode) based on the determined amount of electrostatic buildup. For example, the amount of electrostatic buildup may be determined to be greater than the first threshold value to cause operation of the attraction system to address the electrostatic buildup. Such operation of the attraction system may reduce the amount of electrostatic buildup below the second threshold value and cause subsequent adjustment of the operation of the attraction system. At a certain time after the amount of electrostatic buildup has been reduced below the second threshold value, the amount of electrostatic buildup may increase above the first threshold value again. In response, the operation of the attraction system may be adjusted again to address the electrostatic buildup that has become excessive.

Furthermore, in an embodiment, the method 120 may be performed with respect to a specific object, such as a particular ride vehicle, of the attraction system. By way of example, respective amounts of electrostatic buildup may be monitored for different objects of the attraction system. In response to a determination that the amount of electrostatic buildup associated with a particular object is greater than the first threshold value, the operation of the attraction system may be adjusted to the second operating mode to address the electrostatic buildup for that particular object. As an example, during the operation of the attraction system in the second operating mode, the amount of electrostatic buildup for the particular object (e.g., and not for another object in which the associated amount of electrostatic buildup is not greater than the first threshold value) may be reduced. Indeed, multiple iterations of the method 120 may be performed independently of and/or in parallel with one another for different objects of the attraction system to determine if any one of or a combination of various objects is associated with an excessive electrostatic buildup that is to be addressed. The independent performances of the method 120 may enable the electrostatic buildup for a specific object to be addressed without affecting operation of other objects, thereby enabling more efficient operation of the attraction system to entertain guests.

While only certain features of the disclosed embodiments have been illustrated and described herein, many modifications and changes will occur to those skilled in the art. It is, therefore, to be understood that the appended claims are intended to cover all such modifications and changes as fall within the true spirit of the disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for (perform)ing (a function) . . . " or "step for (perform)ing (a function) . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. An attraction system of an amusement park, the attraction system comprising:
   a sensor configured to monitor electrostatic buildup associated with the attraction system; and
   a control system communicatively coupled to the sensor, wherein the control system is configured to perform operations comprising:
   receiving data from the sensor, wherein the data is indicative of an amount of the electrostatic buildup associated with the attraction system; and
   operating the attraction system based on the data indicative of the amount of the electrostatic buildup associated with the attraction system.

2. The attraction system of claim 1, comprising a ride vehicle, wherein the sensor is configured to monitor electrostatic buildup associated with the ride vehicle.

3. The attraction system of claim 2, wherein the control system is configured to suspend operation of the ride vehicle in response to a determination that an amount of the electrostatic buildup associated with the ride vehicle is greater than a threshold value.

4. The attraction system of claim 3, wherein the ride vehicle is a first ride vehicle, the attraction system comprises a second ride vehicle, the sensor is configured to monitor electrostatic buildup associated with the second ride vehicle, and the control system is configured to continue operation of the second ride vehicle while operation of the first ride vehicle is suspended in response to the determination that the amount of electrostatic buildup associated with the first ride vehicle is greater than the threshold value and that an amount of electrostatic buildup associated with the second ride vehicle is less than the threshold value.

5. The attraction system of claim 1, comprising deionization equipment, wherein the control system is configured to instruct the deionization equipment to operate in response to a determination that the amount of electrostatic buildup associated with the attraction system is greater than a threshold value.

6. The attraction system of claim 5, wherein the deionization equipment comprises a strap, a brush, a chain, a spray system, or any combination thereof.

7. The attraction system of claim 1, wherein the sensor comprises an electrostatic fieldmeter.

8. A non-transitory computer-readable medium comprising instructions that, when executed by processing circuitry, are configured to cause the processing circuitry to perform operations comprising:
monitoring an amount of electrostatic buildup associated with an attraction system;
determining that the amount of electrostatic buildup is greater than a threshold value; and
adjusting operation of the attraction system in response to determining that the amount of electrostatic buildup is greater than the threshold value.

9. The non-transitory computer-readable medium of claim 8, wherein the instructions, when executed by the processing circuitry, are configured to cause the processing circuitry to operate deionization equipment to reduce the amount of electrostatic buildup in response to determining that the amount of electrostatic buildup is greater than the threshold value.

10. The non-transitory computer-readable medium of claim 9, wherein the instructions, when executed by the processing circuitry, are configured to cause the processing circuitry to perform operations comprising:
operating the deionization equipment to output deionization material at a first flow rate in response to determining the amount of electrostatic buildup corresponds to a first value; and
operating the deionization equipment to output the deionization material at a second flow rate in response to determining the amount of electrostatic buildup is associated with a second value that is higher than the first value, wherein the second flow rate is greater than the first flow rate.

11. The non-transitory computer-readable medium of claim 9, wherein the attraction system comprises a plurality of ride vehicles, and the instructions, when executed by the processing circuitry, are configured to cause the processing circuitry to perform operations comprising:
determining that a ride vehicle of the plurality of ride vehicles has an electrostatic buildup amount that is greater than the threshold value; and
operating the deionization equipment to reduce the electrostatic buildup amount associated with the ride vehicle in response to determining that the electrostatic buildup amount associated with the ride vehicle is greater than the threshold value.

12. The non-transitory computer-readable medium of claim 11, wherein the instructions, when executed by the processing circuitry, are configured to cause the processing circuitry to perform operations comprising:
determining that an additional amount of electrostatic buildup associated with an additional ride vehicle of the plurality of ride vehicles is less than the threshold value; and
blocking operation of the deionization equipment from reducing the additional amount of electrostatic buildup associated with the additional ride vehicle in response to determining that the additional amount of electrostatic buildup associated with the additional ride vehicle is less than the threshold value.

13. The non-transitory computer-readable medium of claim 8, wherein the instructions, when executed by the processing circuitry, are configured to cause the processing circuitry to interrupt a flow of electrical power from a power source to the attraction system in response to determining that the amount of electrostatic buildup associated with the attraction system is greater than the threshold value.

14. The non-transitory computer-readable medium of claim 8, wherein the instructions, when executed by the processing circuitry, are configured to cause the processing circuitry to output a notification in response to determining that the amount of electrostatic buildup associated with the attraction system is greater than the threshold value.

15. The non-transitory computer-readable medium of claim 8, wherein the instructions, when executed by the processing circuitry, are configured to cause the processing circuitry to perform operations comprising:
determining a frequency of occurrence in which the amount of electrostatic buildup associated with the attraction system is greater than the threshold value; and
suspending operation of the attraction system in response to determining the frequency is greater than a threshold frequency.

16. An attraction system, comprising:
a ride vehicle; and
a control system configured to perform operations comprising:
operating the attraction system in a first operating mode to move the ride vehicle;
determining that an amount of electrostatic buildup associated with the ride vehicle exceeds a threshold value during operation of the attraction system in the first operating mode; and
adjusting the operation of the attraction system from the first operating mode to a second operating mode to reduce the amount of electrostatic buildup associated with the ride vehicle in response to determining that the amount of electrostatic buildup exceeds the threshold value during the operation of the attraction system in the first operating mode.

17. The attraction system of claim 16, wherein the control system is configured to block movement of the ride vehicle during the operation of the attraction system in the second operating mode.

18. The attraction system of claim 17, comprising an additional ride vehicle, wherein the control system is configured to:
determine that an amount of electrostatic buildup associated with the additional ride vehicle does not exceed the threshold value during the operation of the attraction system in the first operating mode; and
enable movement of the additional ride vehicle during the operation of the attraction system in the second operating mode in response to determining that the amount of electrostatic buildup associated with the additional ride vehicle does not exceed the threshold value during the operation of the attraction system in the first operating mode.

19. The attraction system of claim 16, wherein the threshold value is a first threshold value, and the control system is configured to perform operations comprising:
determining that the amount of electrostatic buildup associated with the ride vehicle is less than a second threshold value in response to operating the attraction system in the second operating mode, wherein the second threshold value is less than the first threshold value; and
adjusting the operation of the attraction system from the second operating mode to the first operating mode in response to determining that the amount of electrostatic buildup associated with the ride vehicle is less than the second threshold value.

20. The attraction system of claim 16, comprising deionization equipment, wherein the control system is configured to perform operations comprising:
   suspending operation of the deionization equipment during the operation of the attraction system in the first operating mode; and
   operating the deionization equipment to reduce the amount of electrostatic buildup associated with the ride vehicle during the operation of the attraction system in the second operating mode.

* * * * *